US011300362B2

(12) United States Patent
Sudhakar et al.

(10) Patent No.: US 11,300,362 B2
(45) Date of Patent: Apr. 12, 2022

(54) HYBRID EVAPORATOR-FEEDING WICKS FOR UNIFORM FLUID DELIVERY TO MULTIPLE HEAT SOURCES IN A VAPOR CHAMBER

(71) Applicant: Toyota Motor Engineering & Manufacturing North America, Inc., Plano, TX (US)

(72) Inventors: Srivathsan Sudhakar, West Lafayette, IN (US); Feng Zhou, South Lyon, MI (US); Ercan M. Dede, Ann Arbor, MI (US); Paul T. Fanson, Howell, MI (US)

(73) Assignee: TOYOTA MOTOR ENGINEERING & MANUFACTURING NORTH AMERICA, INC., Plano, TX (US)

( * ) Notice: Subject to any disclaimer, the term of this patent is extended or adjusted under 35 U.S.C. 154(b) by 107 days.

(21) Appl. No.: 16/264,258

(22) Filed: Jan. 31, 2019

(65) Prior Publication Data

US 2020/0248969 A1 Aug. 6, 2020

(51) Int. Cl.
*F28D 15/04* (2006.01)
*H05K 7/20* (2006.01)
*F28D 15/02* (2006.01)

(52) U.S. Cl.
CPC ....... *F28D 15/046* (2013.01); *F28D 15/0233* (2013.01); *F28D 15/0283* (2013.01); *H05K 7/20309* (2013.01); *H05K 7/20336* (2013.01)

(58) Field of Classification Search
CPC ............. F28D 15/046; F28D 15/0233; H05K 7/20309; H05K 7/20336

USPC .................................................. 165/104.26
See application file for complete search history.

(56) References Cited

U.S. PATENT DOCUMENTS

| 6,056,044 | A | * | 5/2000 | Benson ................. F28D 15/046 |
| | | | | 165/104.26 |
| 6,827,134 | B1 | | 12/2004 | Rightley et al. |
| 7,161,802 | B2 | | 1/2007 | Weber et al. |
| 7,650,931 | B2 | | 1/2010 | Siu |
| 7,828,046 | B2 | | 11/2010 | Huang et al. |

(Continued)

FOREIGN PATENT DOCUMENTS

CN 105118811 B 10/2018

*Primary Examiner* — Leonard R Leo
(74) *Attorney, Agent, or Firm* — Dinsmore & Shohl LLP

(57) ABSTRACT

Embodiments described herein disclose a vapor chamber including a thermally-conductive evaporator wall, a thermally-conductive condenser wall and a volume therebetween defining a vapor core for transporting a vapor of a working fluid from the evaporator wall to the condenser wall. The outer surfaces of the evaporator wall and the condenser wall are configured to be in thermal contact with a plurality of heat sources and a heat sink respectively. The vapor chamber further includes a porous wick structure for holding and pumping the working fluid towards the plurality of heat sources. The wick structure comprises an evaporator-feeding wick having an inner surface in thermal contact with an inner surface of the evaporator wall. The evaporator-feeding wick comprises a first region having a higher permeability than at least a second region to form a permeability gradient, such that the working fluid has a uniform flow to the plurality of heat sources.

5 Claims, 12 Drawing Sheets

(56) References Cited

U.S. PATENT DOCUMENTS

| | | | |
|---|---|---|---|
| 8,857,502 B2* | 10/2014 | Huang | F28D 15/046 |
| | | | 165/104.26 |
| 9,464,849 B2 | 10/2016 | Uchida et al. | |
| 9,835,383 B1 | 12/2017 | Roper et al. | |
| 10,724,803 B2* | 7/2020 | Huang | F28D 15/046 |
| 2006/0124281 A1* | 6/2006 | Rosenfeld | F28D 15/046 |
| | | | 165/104.26 |
| 2009/0025910 A1* | 1/2009 | Hoffman | F28D 15/046 |
| | | | 165/104.26 |
| 2009/0308571 A1 | 12/2009 | Thompson et al. | |
| 2010/0078151 A1 | 4/2010 | Koenigsberg et al. | |
| 2010/0294467 A1* | 11/2010 | Varanasi | F28D 15/046 |
| | | | 165/108 |
| 2010/0294475 A1* | 11/2010 | Rush | F28D 15/046 |
| | | | 165/185 |
| 2011/0094712 A1* | 4/2011 | Hou | F28D 15/046 |
| | | | 165/104.26 |
| 2017/0047625 A1 | 2/2017 | Bhunia et al. | |
| 2020/0208920 A1* | 7/2020 | Thayer | F28D 15/046 |

* cited by examiner

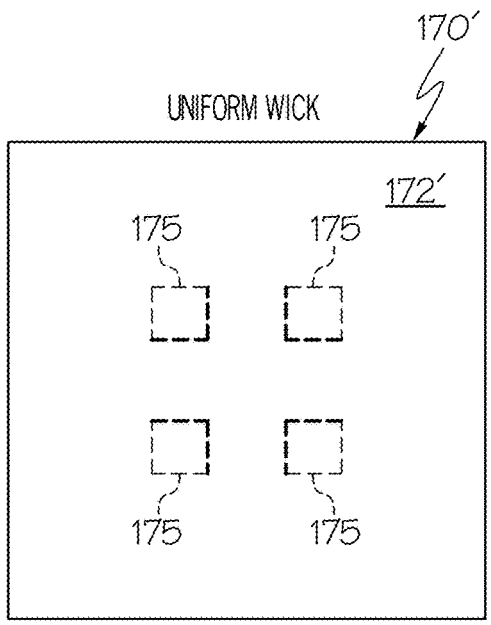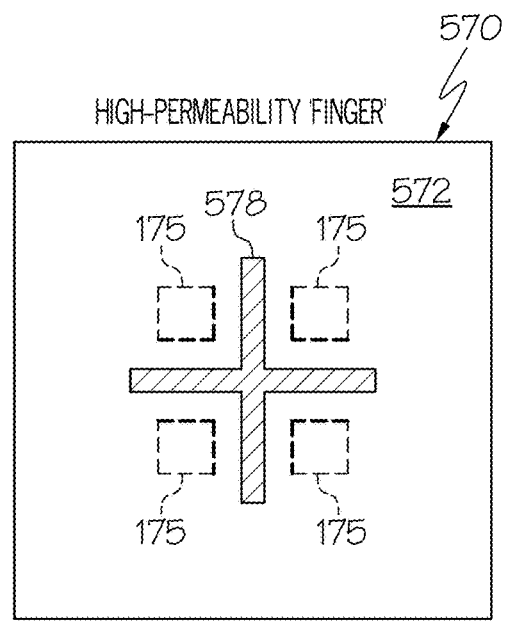
FIG. 9A
FIG. 9B
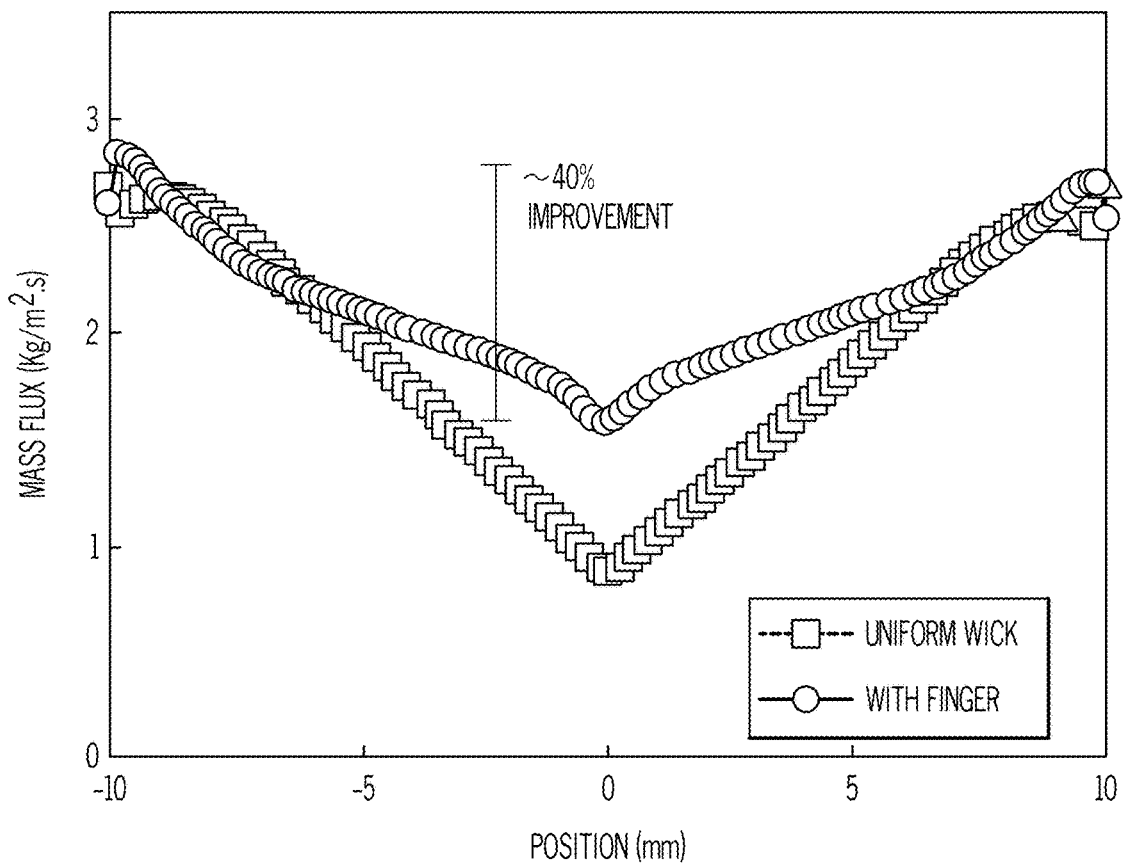
FIG. 9C

HYBRID EVAPORATOR-FEEDING WICKS FOR UNIFORM FLUID DELIVERY TO MULTIPLE HEAT SOURCES IN A VAPOR CHAMBER

TECHNICAL FIELD

The present specification generally relates to a cooling mechanism for electronics applications and more specifically to apparatuses and methods for uniform fluid delivery to multiple heat sources (such as power electronics devices) in thermal contact with a vapor chamber.

BACKGROUND

Development of heat spreading technologies in next-generation thermal management systems require dissipation of high heat loads above one kW/cm$^2$ over relatively large heat input areas (one cm$^2$). Vapor chambers are widely used in thermal management applications as an effective means of spreading heat from one or more localized heat sources. The vapor chamber utilizes two-phase boiling/condensing phenomena in order to uniformly spread the heat from the surface of the heat sources to the surface of a heat sink. The vapor chamber is filled with a working fluid that evaporates when locally heated. The vapor flows away from the hotspot and condenses over a heat rejection surface adjacent to a heat sink. A porous wick structure lining the inside of the vapor chamber holds and pumps the liquid back to the heat sources via capillary action. This two-phase cycle allows passive heat spreading at a temperature gradient that can be orders of magnitude lower than conduction through solid materials. Vapor chambers have high reliability and passive operation and can thus act as an effective heat transport.

When high heat fluxes are generated by the use of multiple heat sources interfaced to the vapor chamber, large variation in the fluid mass flux in different portions of the heat sources can induce a large drop in the pressure of the working fluid in the porous wick structure, particularly near the heat sources. This could potentially starve the heat sources from effective fluid supply and cause dryout in the porous wick structure since all the working fluid in the proximity of the heat sources is vaporized. It is thus desirable to design the porous wick structure in order to ensure uniform fluid delivery to the heat sources.

SUMMARY

The present specification relates to apparatuses and methods for uniform fluid delivery to multiple heat sources in thermal contact with a vapor chamber. In one embodiment, a vapor chamber includes a thermally-conductive evaporator wall, a thermally-conductive condenser wall and a volume between the evaporator wall and the condenser wall defining a vapor core for transporting a vapor of a working fluid from the evaporator wall to the condenser wall. An outer surface of the evaporator wall is configured to be in thermal contact with a plurality of heat sources. An outer surface of the condenser wall is configured to be in thermal contact with a heat sink. The vapor chamber further includes a porous wick structure for holding and pumping the working fluid towards the plurality of heat sources. The porous wick structure comprises an evaporator-feeding wick having an inner surface in thermal contact with an inner surface of the evaporator wall. The evaporator-feeding wick comprises a first region having a higher permeability than at least a second region to form a permeability gradient thereon, such that the working fluid has a uniform flow to the plurality of heat sources.

In another embodiment, a porous wick structure for holding and pumping a working fluid flowing within a vapor chamber for absorbing heat dissipated by a plurality of heat sources in thermal contact with an evaporator wall of the vapor chamber is disclosed. The porous wick structure comprises sintered particles of a metal or an alloy based on one or more metals selected from at least one of: nickel, copper, molybdenum, niobium, aluminum, iron, cobalt, and titanium. The porous wick structure comprises an evaporator-feeding wick, wherein an inner surface of the evaporator-feeding wick is in thermal contact with an inner surface of the evaporator wall. The evaporator-feeding wick comprises a first region having a higher permeability than at least a second region to form a permeability gradient thereon, such that the working fluid has a uniform flow to the plurality of heat sources. The first region is located in one or more areas of the evaporator-feeding wick where a flow of the working fluid has less than a predetermined threshold of uniformity.

In yet another embodiment, a method of fabricating an evaporator-feeding wick having a uniform flow of a working fluid therethrough for lining an evaporator wall of a vapor chamber, is disclosed. First, numerical simulation is performed to determine whether the working fluid has a uniform flow towards a plurality of heat sources in thermal contact with the vapor chamber. One or more areas of the evaporator-feeding wick where a flow of the working fluid has less than a predetermined threshold of uniformity is then determined. A simulation model of the evaporator-feeding wick is functionally graded by introduction of a first region in the one or more areas of the simulation model until the working fluid is determined to have a uniform flow. The first region has a higher permeability than at least a second region to form a permeability gradient thereon. Finally, the evaporator-feeding wick is fabricated in accordance with the functionally graded simulation model.

These and additional features provided by the embodiments described herein will be more fully understood in view of the following detailed description, in conjunction with the drawings.

BRIEF DESCRIPTION OF THE DRAWINGS

The embodiments set forth in the drawings are illustrative and exemplary in nature and not intended to limit the subject matter defined by the claims. The following detailed description of the illustrative embodiments can be understood when read in conjunction with the following drawings, where like structure is indicated with like reference numerals and in which:

FIGS. 9A-9B depict top views of an uniform evaporator-feeding wick and a hybrid evaporator-feeding wick for a vapor chamber in thermal contact with four heat sources symmetrically arranged in a 2×2 array and FIG. 9C depicts a graphical comparison of the fluid mass flux profiles between the evaporator wicks of the uniform evaporator-feeding wick and the hybrid evaporator-feeding wick, according to one or more embodiments shown and described herein;

DETAILED DESCRIPTION

Embodiments described herein are directed to apparatuses and methods for uniform fluid delivery to multiple heat sources (such as power electronics devices) in thermal contact with a vapor chamber. This is achieved by introducing regions of higher permeability within a porous wick structure on the evaporator side of the vapor chamber. The regions are introduced in areas of the wick structure having proximity to the heat sources and can have various shapes. The modification of the properties of the wick structure and formation of a permeability gradient therein preferentially draws more working fluid close to the heat sources and enables a more uniform flow to the heat sources. As used herein, "uniform flow" means the structure has a fluid mass flux with an average deviation of less than 10% from the median value of the fluid mass flux along a length of the structure. The permeability gradient can be further adjusted by introduction of more regions of varying permeability to minimize the variability and flow resistance of the working fluid, such that the working fluid has a uniform flow to the heat sources.

Figure 1:
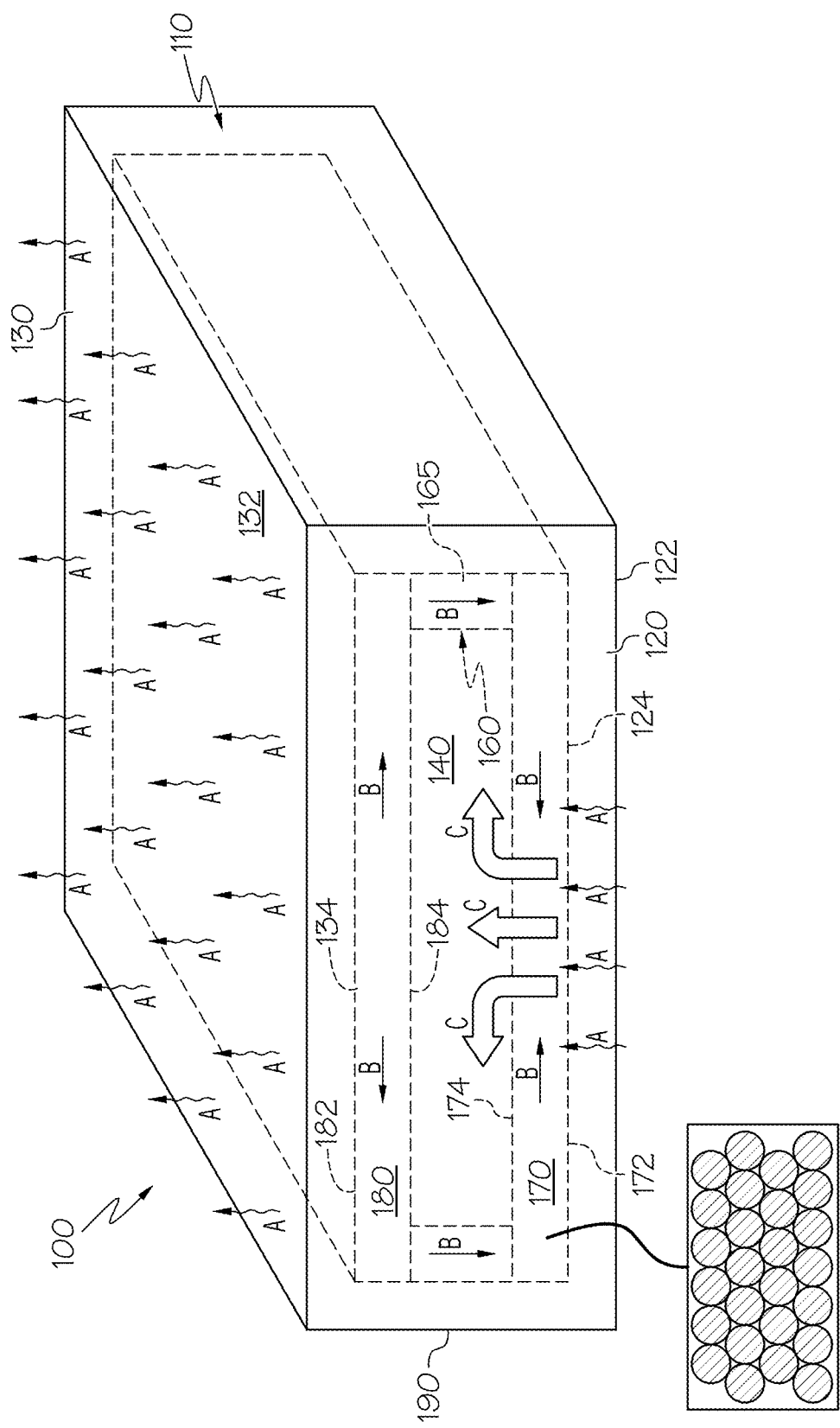
FIG. 1 depicts a three-dimensional schematic view of a vapor chamber, according to one or more embodiments shown and described herein.
Figure 2:
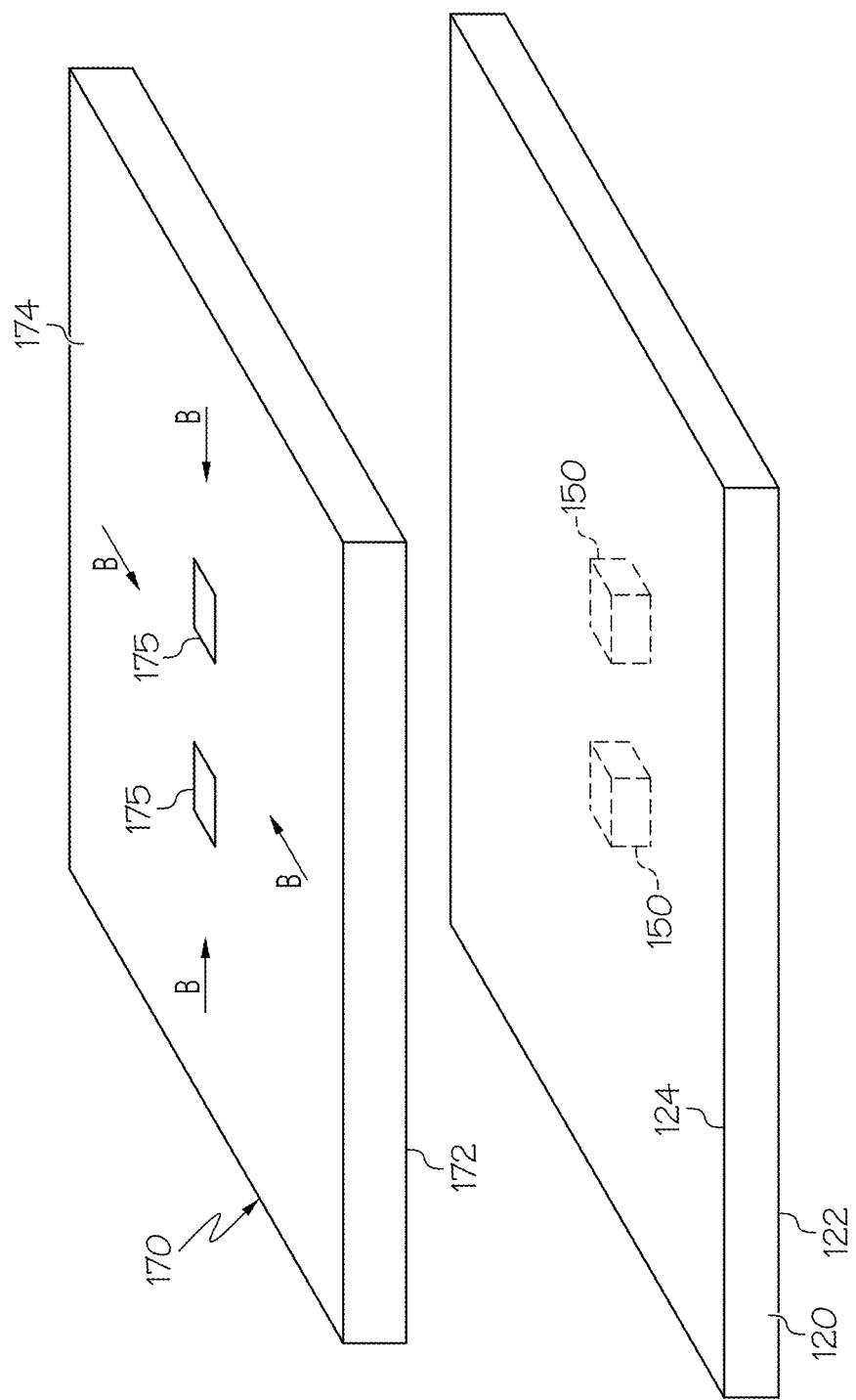
FIG. 2 depicts a three-dimensional exploded view of an uniform evaporator-feeding wick in thermal contact with an evaporator wall of the vapor chamber, according to one or more embodiments shown and described herein.
Figure 3:
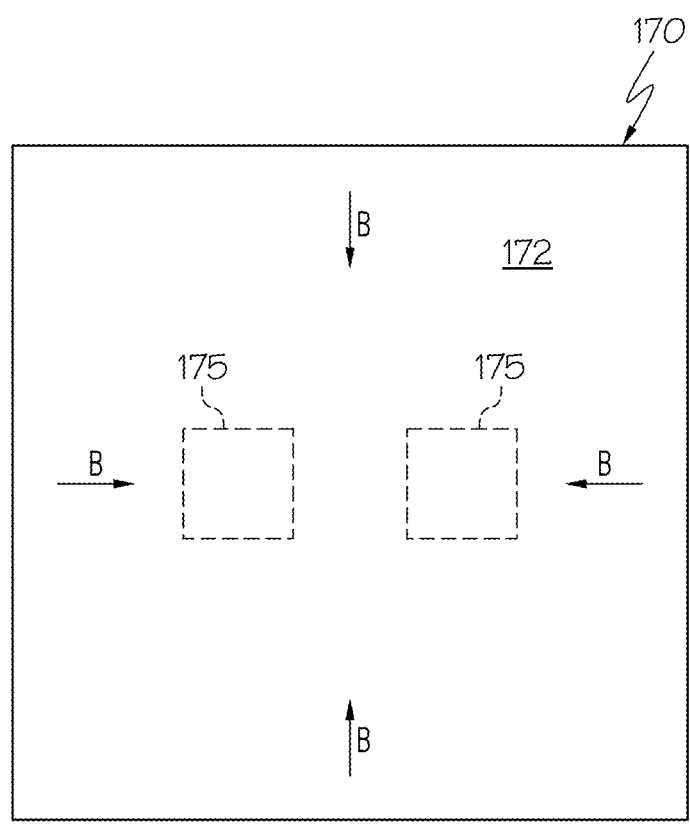
FIG. 3 depicts a top view of the uniform evaporator-feeding wick for the vapor chamber, according to one or more embodiments shown and described herein.

FIGS. 1-3 show an example vapor chamber 100 for removing heat and lowering the maximum operating temperature of two heat sources 150. Each of the heat sources 150 may be a power electronics device. As a non-limiting example, the power electronics device may be used in an inverter circuit of an electric vehicle. Non-limiting examples of the power electronics device include MOSFET (metal-oxide semiconductor field-effect transistor), IGBT (insulated-gate bipolar transistor), and the like. FIG. 1 depicts a three-dimensional schematic view of the vapor chamber 100. The vapor chamber 100 includes a housing 110 having an evaporator wall 120, a condenser wall 130 and side walls 190. The evaporator wall 120 has an outer surface 122 and an inner surface 124. The condenser wall 130 is positioned opposite to the evaporator wall 120 and has an outer surface 132 and an inner surface 134. The outer surface 122 of the evaporator wall 120 is in thermal contact with the two heat sources 150. As referred herein, "thermal contact" means a direct or indirect connection between two surfaces that allows the exchange of heat between the surfaces. The outer surface 132 of the condenser wall 130 can be configured to be in thermal contact with a heat sink (not shown). The heat sink is a heat exchanging device for removing heat from a vapor of a coolant to transform the vapor into liquid form. The evaporator wall 120 and the condenser wall 130 are made of a thermally-conductive material. As referred herein, "thermally-conductive" means a material having a thermal conductivity greater than or equal to 25 W/(m K). In some embodiments, the evaporator wall 120 may have a thermal expansion coefficient matching the thermal expansion coefficient of the plurality of the heat sources 150.

The evaporator wall 120 is lined with an evaporator-feeding wick 170 and the condenser wall 130 is lined with a condenser-feeding wick 180. The evaporator-feeding wick 170 has an outer surface 174 and an inner surface 172 in thermal contact with the inner surface 124 of the evaporator wall 120. The condenser-feeding wick 180 has an outer surface 184 and an inner surface 182 in thermal contact with the inner surface 134 of the condenser wall 130. Evaporator wicks 175 (FIG. 2) transfer heat from the two heat sources 150 in the vapor form of the working fluid and occupy areas of the inner surface 172 of the evaporator-feeding wick 170 directly above the two heat sources 150. FIG. 2 shows a three-dimensional exploded view of the uniform evaporator-feeding wick 170 in thermal contact with the evaporator wall 120 of the vapor chamber 100, while FIG. 3 depicts a top view of the uniform evaporator-feeding wick 170.

Still referring to FIG. 1, the evaporator-feeding wick 170 and the condenser-feeding wick 180 are separated by the side wicks 165 on both sides and together form a porous wick structure 160. In some embodiments, the wick structure 160 is made of sintered particles of a metal or a metal alloy. As non-limiting examples, the metals may be nickel, copper, molybdenum, niobium, aluminum, iron, cobalt, and/or titanium. The wick structure 160 is responsible for holding and pumping a working fluid from the condenser wall 130 to the evaporator wall 120 by capillary action. The wick structure 160 is uniformly porous in nature and may be composed of sintered particles (for example, in the 90-106 μm size range). The volume between the evaporator wall 120 lined by the evaporator-feeding wick 170 and the condenser wall 130 lined by the condenser-feeding wick 180 defines a vapor core 140 for transporting a vapor of the working fluid from the evaporator wall 120 to the condenser wall 130.

As a non-limiting example, the working fluid may be water. The thermophysical properties of water, for example, may be ideal for operating temperatures from about 0 degrees Celsius to about 200 degrees Celsius. However, the use of working fluids other than water such as, but not limited to methanol, is also contemplated.

In operation, heat generated by the heat sources 150 boils the working fluid in the wick structure 160. The flow of heat from the evaporator wall 120 to the condenser wall 130 is denoted by arrows A in FIGS. 1-3. Due to boiling, heat from the heat sources 150 is absorbed by the working fluid to form a vapor near the evaporator wall 120. The vapor rises through the vapor core 140 towards the condenser wall 130. The flow of the vapor is denoted by arrows C in FIGS. 1-3. When the heat is disposed at the heat sink connected to the condenser wall 130, the vapor condenses into a liquid state of the working fluid and is carried back to the evaporator wall 120 by the wick structure 160 along the condenser-feeding wick 180, the side wick 165 and the evaporator-feeding wick 170 by capillary action. The direction of flow of the working fluid in the liquid form is denoted by arrows B in FIGS. 1-3.

When the two or more heat sources 150 are interfaced with the evaporator wall 120 of the vapor chamber 100, high heat flux is generated. The high heat flux creates a large drop in capillary pressure of the working fluid flowing through the wick structure 160 and there may not be sufficient time for the working fluid to travel back to the evaporator wick 175. Using an evaporator-feeding wick 170 of uniform permeability creates large variations in the fluid flow towards the heat sources 150. At high heat flux, any such variation in fluid flow towards the evaporator wicks 175 can induce local or partial dryout on the inner surface 172 of the evaporator-feeding wick 170 near the evaporator wicks 175. The region farthest away from the edge of the feeding area on the evaporator-feeding wick 170 is most likely to be devoid of the working fluid at a high heat flux. In FIGS. 1-3, the region between the two evaporator wicks 175 that correspond to the location of the two heat sources 150 is most likely to be devoid of the working fluid at a high heat flux. Since the working fluid evaporates at a rate higher than it is replenished in the region at or near the evaporator wicks 175, only vapor is formed which can thus potentially starve the heat sources 150 from effective fluid supply, leading to an unfavorable increase in thermal resistance and decrease in cooling efficiency of the vapor chamber. The heat sources 150 may even become damaged as a result.

In some embodiments, the local or partial dryout on the inner surface 172 of the evaporator-feeding wick 170 near the evaporator wicks 175 is mitigated by reducing the variability of the flow of the working fluid through the evaporator-feeding wick 170. One or more regions of high permeability are provided in one or more areas on the evaporator-feeding wick 170 that suffer from dryout due to little or no flow of the working fluid, i.e. one or more areas where a flow of the working fluid has less than a predetermined threshold of uniformity. As a non-limiting example, the predetermined threshold of uniformity may be defined as having an average deviation of about 5% from the median value of the fluid mass flux (in $Kg/m^2s$) along a position between the evaporator wicks 175, such that only a fluid mass flux of the working fluid less than the threshold may be considered as uniform. In the example shown in FIGS. 1-3, the one or more high-permeability regions can be introduced between the two evaporator wicks 175 each of which corresponds to the location of each of the two heat sources 150.

Figure 4A:
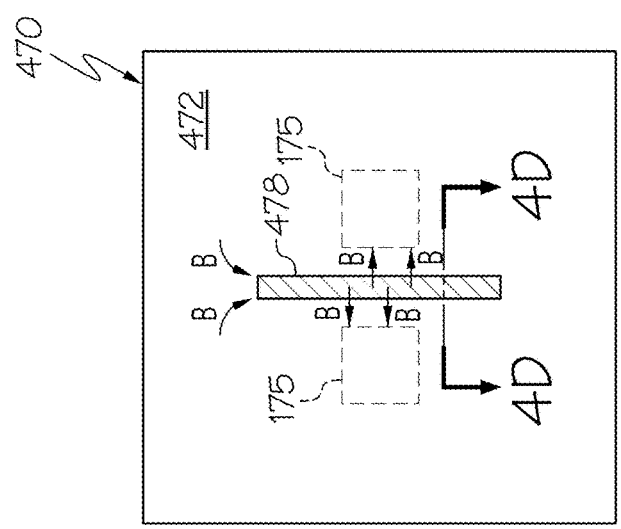
FIGS. 4A-4C depict top views of three different configurations of hybrid evaporator-feeding wicks for a vapor chamber in thermal contact with two symmetrically arranged heat sources and FIG. 4D depicts a representative cross-sectional view of a hybrid evaporator-feeding wick, according to one or more embodiments shown and described herein.
Figure 4B:
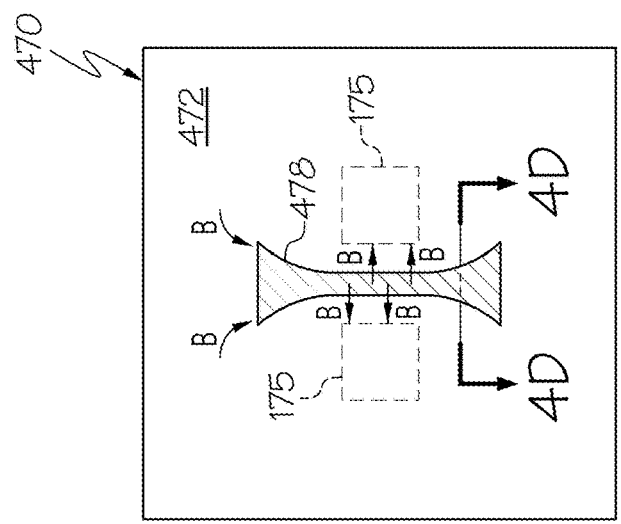
Figure 4C:
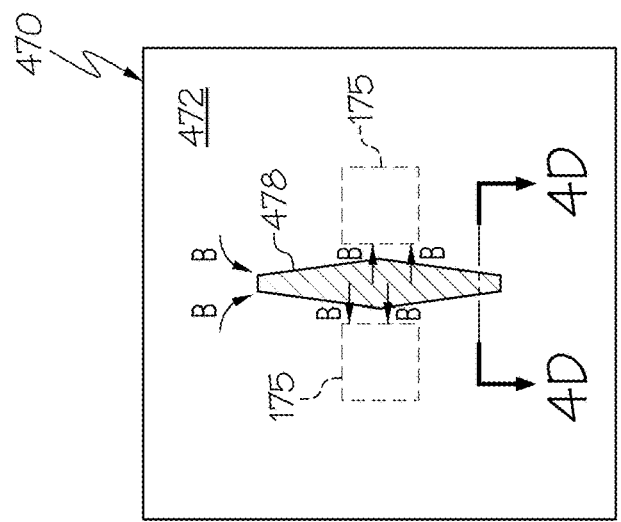
Figure 4D:
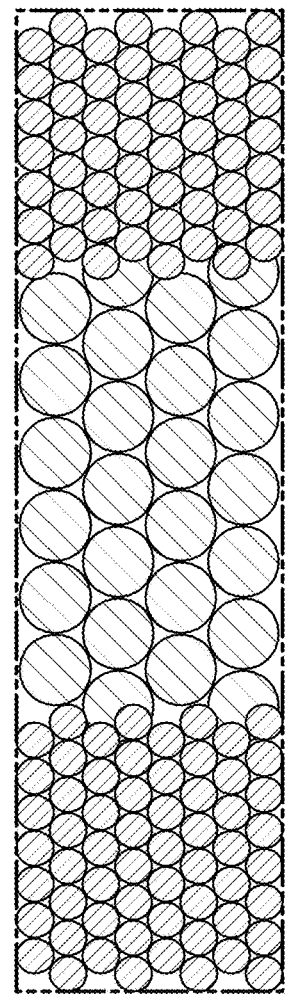

FIGS. 4A-4C depict top views of three different configurations of hybrid evaporator-feeding wick 470 for the vapor chamber 100, where the vapor chamber 100 is in thermal contact with two symmetrically arranged heat sources 150. The inner surface 472 of the evaporator-feeding wick 470 has a high-permeability region 478 that draws in more working fluid from the edges of the evaporator-feeding wick 470 and distributes it to the two evaporator wicks 175 such that the heat sources 150 receive a continuous supply of the working fluid. The high-permeability region 478 has a higher permeability than the surrounding areas of the evaporator-feeding wick 470. In FIG. 4A, the high-permeability region 478 is shaped like a finger or a straight rectangular bar. However, the embodiments are not limited to the configurations shown in FIG. 4A. In FIG. 4B, the high-permeability region 478 is shaped like an hourglass having wider ends to draw more working fluid from the edges of the evaporator-feeding wick 470. In FIG. 4C, the high-permeability region 478 has wider central regions between the two heat sources 150 and thinner regions away from the two heat sources 150. FIG. 4D depicts a representative cross-sectional view of the hybrid evaporator-feeding wick 470 shown in FIGS. 4A-4C. FIG. 4D shows that the hybrid evaporator-feeding wick 470 includes the high-permeability region 478 having larger particles introduced between regions having smaller particles. There are larger spaces between the larger particles, thus allowing more working fluid to flow through by capillary action. The direction of flow of the working fluid in liquid form is denoted by arrows B.

In some embodiments, the high-permeability region 478 can be introduced by sintering particles having larger size (about 180-212 am in diameter) than the conventional smaller particles (about 90-106 am in diameter) of the hybrid evaporator-feeding wick 470 in the one or more areas that suffer from dryout. Generally, sintering is a process of forming a solid material by applying heat and pressure for a period of time while not melting the material to the point of liquefaction. In some embodiments, sintering comprises applying a pressure and heat at an elevated temperature to metal particles in a mold set for a period of time in a reducing or inert atmosphere. The sintering pressure and temperature are determined based on the type of particles being sintered and the desired permeability or porosity of the hybrid evaporator-feeding wick 470. In other embodiments, the permeability of the hybrid evaporator-feeding wick 470 can be controlled by adjusting the sintering time and the sintering temperature. In some embodiments, the sintering temperature is between about 500 degrees Celsius and about 1000 degrees Celsius. In some embodiments, the sintering time is between about 30 minutes and about 30 hours. The higher the sintering temperature, the shorter the sintering time required to achieve a desired degree of bonding between the larger particles in the high-permeability region 478 and the conventional smaller particles surrounding them. The permeability of sintered particles is directly proportional to the square of the average particle size in diameter.

In other embodiments, the high-permeability region 478 can be introduced without the need for modifying particle size. The one or more areas on the inner surfaces 472 of the hybrid evaporator-feeding wick 470 that have little or no flow of the working fluid may be modified using a chemical or surface treatment to decrease the flow resistance therein.

The chemical treatment may include one or more of: reduction, oxidation, or passivation of the one or more areas using hydrogen, oxygen, or an inert gas, or application of a polymer, surfactant, thin film, etc. The surface treatment may include modification of the particle surface morphology by polishing, roughening, patterning, etc. The surface treatment could either be performed prior to the formation of the hybrid evaporator-feeding wick 470 or in-situ after the particles are shaped into the hybrid evaporator-feeding wick 470. Thus in some embodiments, the high-permeability region 478 may comprise chemically-treated particles or surface-treated particles instead of sintered particles.

Figure 5C:
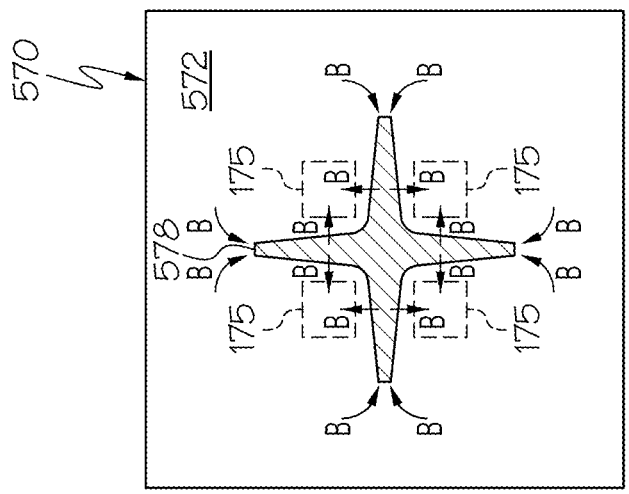
FIGS. 5A-5C depict top views of three different configurations of hybrid evaporator-feeding wicks for a vapor chamber in thermal contact with four heat sources symmetrically arranged in a 2×2 array, according to one or more embodiments shown and described herein.
Figure 5B:
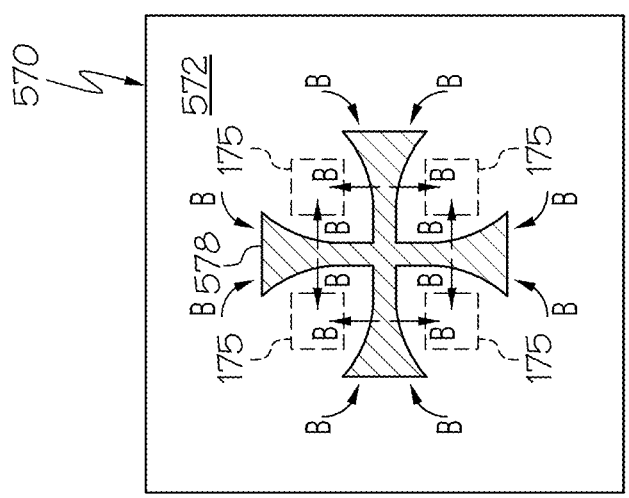
Figure 5A:
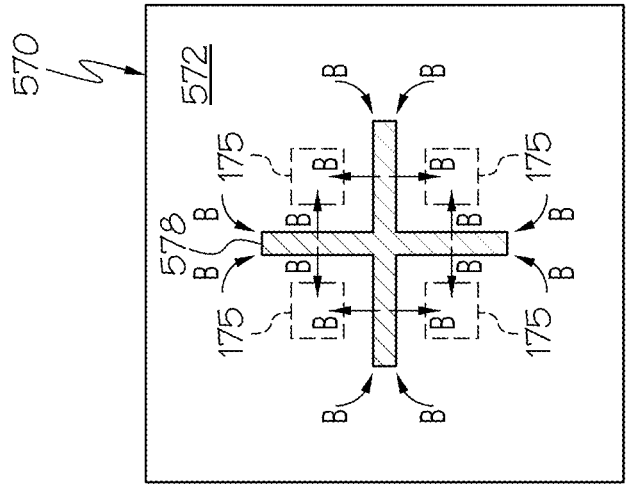

The idea behind the hybrid evaporator-feeding wick 470 may be implemented in vapor chambers configured to cool more than the two heat sources 150. FIGS. 5A-5C depict top views of three different configurations of hybrid evaporator-feeding wick 570 for the vapor chamber 100, where the vapor chamber 100 is in thermal contact with four heat sources 150 symmetrically arranged in a 2×2 array. The inner surface 572 of the evaporator-feeding wick 570 has a high-permeability region 578 that draws in more working fluid from the edges of the evaporator-feeding wick 570 and distributes it to the four evaporator wicks 175 such that the four heat sources 150 receive a continuous supply of the working fluid. In FIG. 5A, the high-permeability region 578 is shaped like a cross of two fingers or straight rectangular bars. In FIG. 5B, the high-permeability region 578 is shaped like a cross of two hourglasses having wider ends to draw more working fluid from the edges of the evaporator-feeding wick 570. In FIG. 5C, the high-permeability region 578 is shaped like a cross of two bars, each having wider central regions near the four heat sources 150 and thinner regions away from the four heat sources 150. The high-permeability region 578 may be introduced in similar ways as the high-permeability region 478. The direction of flow of the working fluid in liquid form is denoted by arrows B.

Figure 6A:
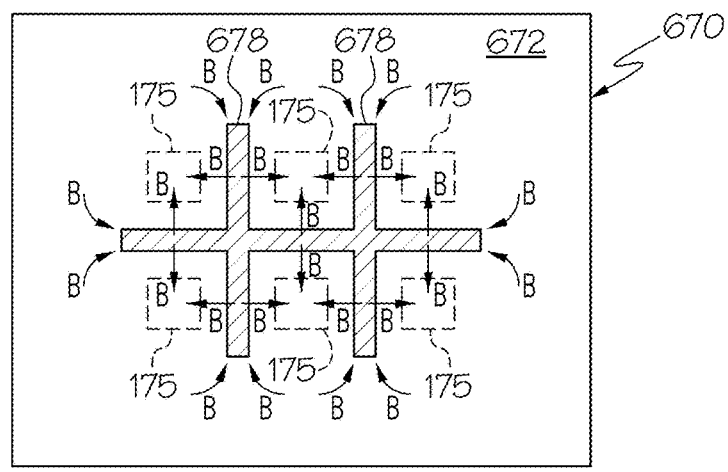
FIGS. 6A-6C depict top views of three different configurations of hybrid evaporator-feeding wicks for a vapor chamber in thermal contact with six heat sources symmetrically arranged in a 2×3 array, according to one or more embodiments shown and described herein.
Figure 6B:
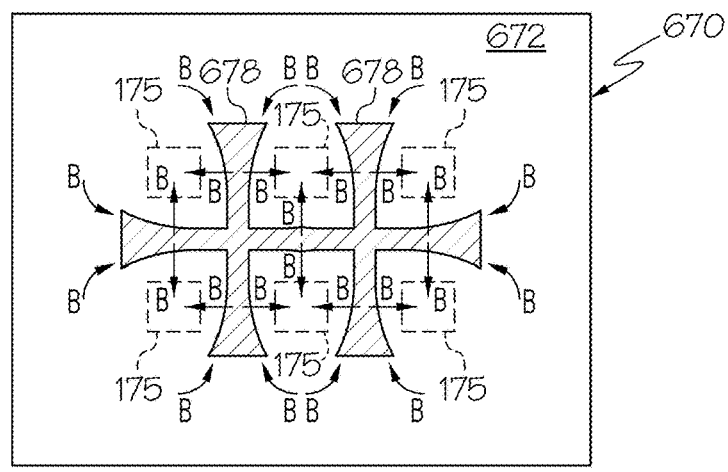
Figure 6C:
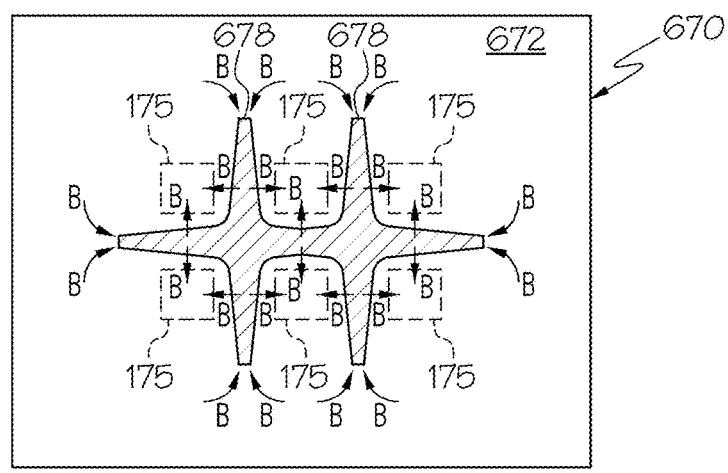

FIGS. 6A-6C depict top views of three different configurations of hybrid evaporator-feeding wick 670 for the vapor chamber 100, where the vapor chamber 100 is in thermal contact with six heat sources 150 symmetrically arranged in a 2×3 array. The inner surface 672 of the evaporator-feeding wick 670 has a high-permeability region 678 that draws in more working fluid from the edges of the evaporator-feeding wick 670 and distributes it to the six evaporator wicks 175 such that the six heat sources 150 receive a continuous supply of the working fluid. In FIG. 6A, the high-permeability region 678 is shaped like a double-cross of two fingers or straight rectangular bars. In FIG. 6B, the high-permeability region 678 is shaped like a double cross of two hourglasses having wider ends to draw more working fluid from the edges of the evaporator-feeding wick 670. In FIG. 6C, the high-permeability region 678 is shaped like a double cross of two bars, each having wider central regions near the six heat sources 150 and thinner regions away from the six heat sources 150. The high-permeability region 678 may be introduced in similar ways as the high-permeability region 478. The direction of flow of the working fluid in liquid form is denoted by arrows B.

The introduction of one or more high-permeability regions 478, 578, 678 creates a permeability gradient on the inner surfaces 472, 572, 672 of the hybrid evaporator-feeding wicks 470, 570, 670 respectively such that the working fluid has a uniform flow towards the plurality of evaporator wicks 175 above each of the plurality of heat sources 150. The permeability gradient can be iteratively adjusted until the working fluid is determined to have a uniform flow towards the heat sources 150.

The reduction in flow variability of the working fluid through the hybrid evaporator-feeding wicks 470, 570, 670 and hence increase in its flow uniformity towards the evaporator wicks 175 and the heat sources 150 is evident through three-dimensional numerical simulation performed on a commercially-available computational fluid dynamics software (for example, Fluent™) using porous media flow conditions. The numerical simulation was performed on both the uniform evaporator-feeding wick 170 and the hybrid evaporator-feeding wick 470 and utilized several assumptions. The outer edges of the uniform evaporator-feeding wick 170 and the hybrid evaporator-feeding wick 470 were assumed to have a zero-pressure boundary condition. The inner edges of each evaporator wick 175 corresponding to each heat source 150 were assumed to have a fluid mass flux boundary condition representing an assumed conversion of the entire mass of the working fluid fed to the heat source 150 within the area of the evaporator wick 175 into vapor form for a specified heat input from the heat source 150. Additionally, the two heat sources 150 in thermal contact with the uniform evaporator-feeding wick 170 and the hybrid evaporator-feeding wick 470 were given equal heat inputs of 500 W. The flow simulation under porous media flow conditions considered the inertial and viscous dissipations with the inverse permeability and an inertial resistance coefficient as the inputs for the flow domain.

Figure 7A:
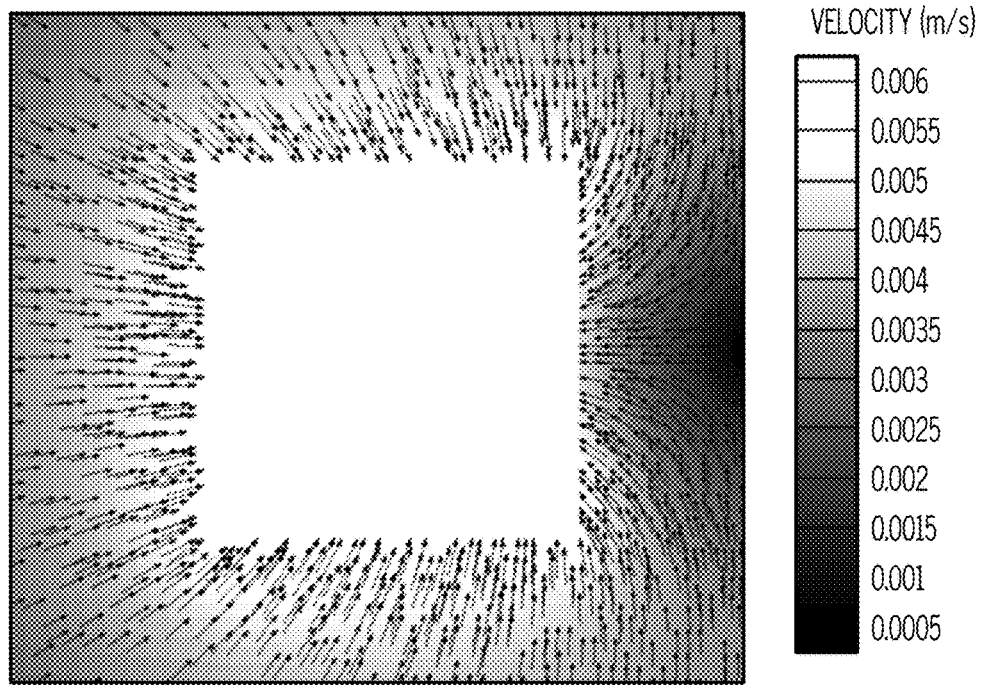
FIGS. 7A-7B depict distribution of fluid velocity vectors overlaid on the fluid velocity contours of an evaporator wick of the uniform evaporator-feeding wick and the hybrid evaporator-feeding wick respectively, according to one or more embodiments shown and described herein.
Figure 7B:
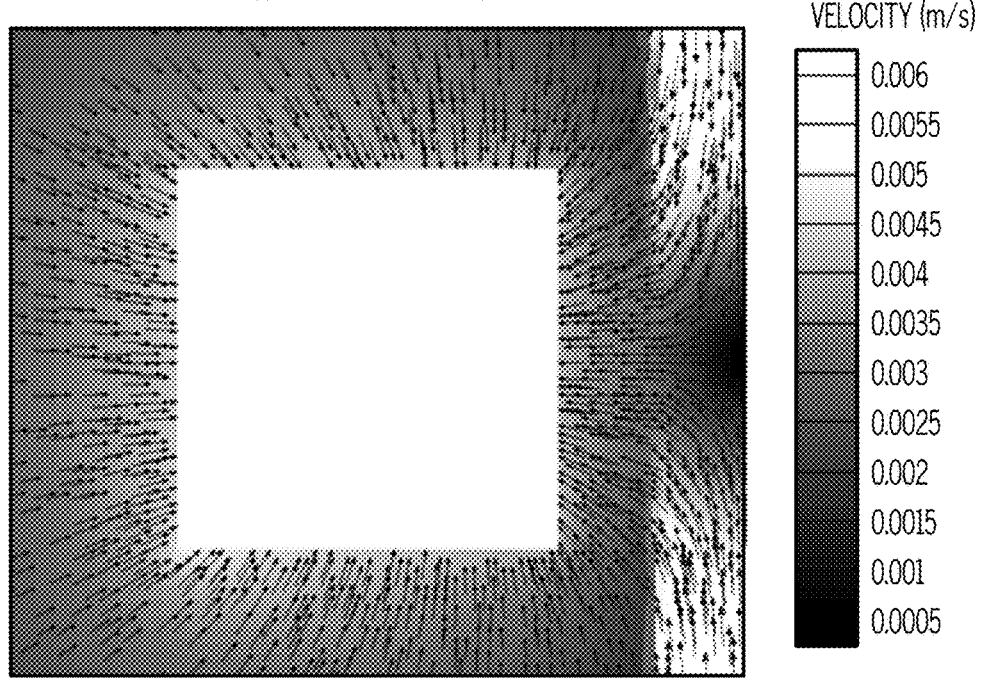

The numerical simulation highlighted the differences in flow of the working fluid between the uniform evaporator-feeding wick 170 and the hybrid evaporator-feeding wick 470. FIGS. 7A-7B depict distribution of fluid velocity vectors overlaid on the fluid velocity contours of an evaporator wick of the uniform evaporator-feeding wick 170 and the hybrid evaporator-feeding wick 470 having the finger-shaped high-permeability region 478 (shown in FIG. 4A) respectively on the same scale. It is seen that the high-permeability region 478 locally draws in more working fluid, indicated by the higher velocities in the finger towards the right of FIG. 7B. For this reason, the flow of the working fluid is more uniform across the edges of the evaporator wick 175 above the heat source 150 in FIG. 7B than in FIG. 7A.

Figure 8:
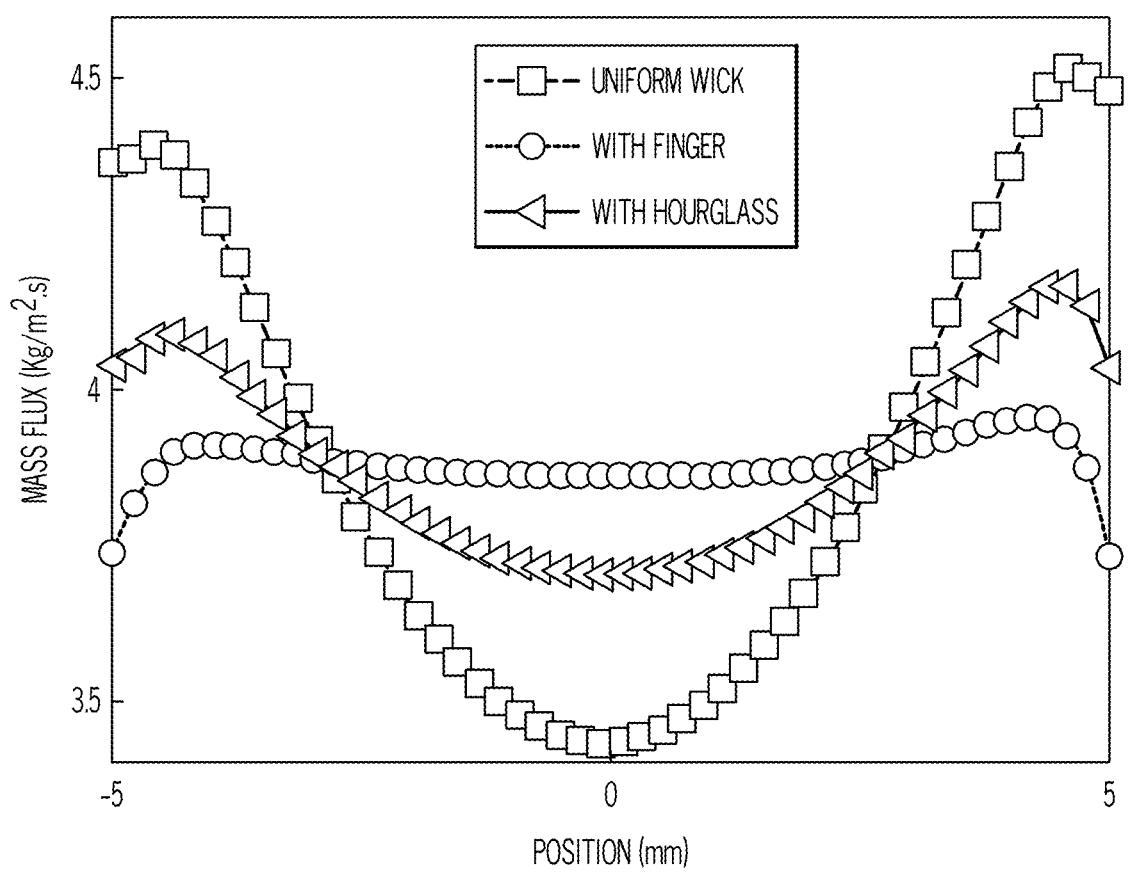
FIG. 8 depicts a graphical comparison of the fluid mass flux profiles between the evaporator wicks of the uniform evaporator-feeding wick and two different configurations of hybrid evaporator-feeding wicks, according to one or more embodiments shown and described herein.

FIG. 8 depicts a graphical comparison of the fluid mass flux profiles between the evaporator wicks 175 above the heat sources 150 for the uniform evaporator-feeding wick 170 and the hybrid evaporator-feeding wick 470 having a finger-shaped and an hourglass-shaped high-permeability region 478 (shown in FIGS. 4A and 4B respectively). The position between the two evaporator wicks 175 is plotted in the X-axis such that the center of the region between the two evaporator wicks 175 has zero X-axis coordinate. As is evident from the graphical comparison of FIG. 8, the uniform evaporator-feeding wick 170 provides a highly non-uniform fluid mass flux—the central region between the evaporator wicks 175 receives about 25% less fluid mass flux than the outer regions. The fluid mass flux of the uniform evaporator-feeding wick 170 has an average deviation of about 13% from the median value of the fluid mass flux (3.9 KG/m$^2$s) along the X-axis between the two evaporator wicks 175. On the other hand, the high-permeability region 478 improves the uniformity of the fluid mass flux profiles of the hybrid evaporator-feeding wick 470. The hybrid evaporator-feeding wick 470 having the finger-shaped high-permeability region 478 has a fluid mass flux with an average deviation of about 2% from the median value of the fluid mass flux (3.9 KG/m$^2$s) along the X-axis, while the hybrid evaporator-feeding wick 470 having the hourglass-shaped high-permeability region 478 has a fluid mass flux with an average deviation of about 4% from the median value of the fluid mass flux (3.9 KG/m²s) along the X-axis. The finger-shaped high-permeability region 478 thus provides the best uniformity in the fluid mass flux and about two-fold improvement in uniformity than the hourglass-shaped high-permeability region 478.

FIGS. 9A-9B depict top views of a uniform evaporator-feeding wick 170' and the hybrid evaporator-feeding wick 570 for the vapor chamber 100, where the vapor chamber 100 is in thermal contact with four heat sources 150 symmetrically arranged in a 2×2 array. Four evaporator wicks 175 are positioned above the four heat sources 150 on the inner surfaces 172' and 572 of the uniform evaporator-feeding wick 170' and the hybrid evaporator-feeding wick 570 respectively. Numerical simulation was performed on both the uniform evaporator-feeding wick 170 and the hybrid evaporator-feeding wick 470, utilizing the same assumptions as noted earlier and the heat sources 150 were given equal heat inputs of 250 W. FIG. 9C depicts a graphical comparison of the fluid mass flux profiles between the evaporator wicks 175 above the heat sources 150 for the uniform evaporator-feeding wick 170' and the hybrid evaporator-feeding wick 570. As in FIG. 8, the position between the four evaporator wicks 175 is plotted in the X-axis such that the center of the region between the four evaporator wicks 175 has zero X-axis coordinate. As is evident from the graphical comparison of FIG. 9C, the high-permeability region 578 shaped like a cross of two fingers improves the uniformity of the fluid mass flux profile of the hybrid evaporator-feeding wick 570 by 40% over the uniform evaporator-feeding wick 170'.

Figure 10:
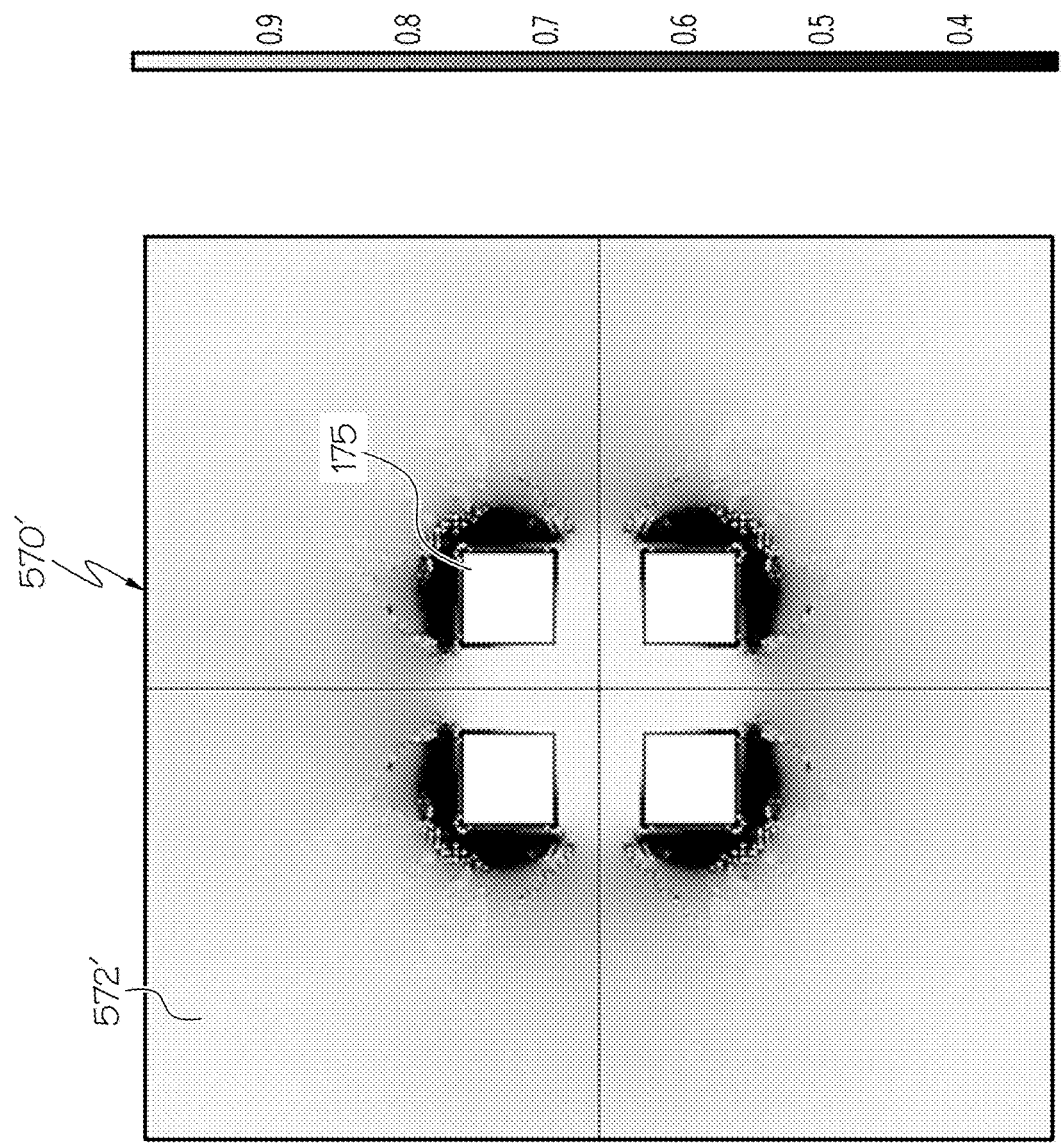
FIG. 10 depicts a top view graphical representation of the fluid mass flux profiles of a topologically-optimized hybrid evaporator-feeding wick for a vapor chamber in thermal contact with four heat sources symmetrically arranged in a 2×2 array, according to one or more embodiments shown and described herein.

As evident herein, the presence of the high-permeability regions 478, 578, 678 preferentially redistributes the flow of the working fluid and increases the local feeding in between the evaporator wicks 175 above the heat sources 150 for a more uniform fluid mass flux profile. A complete gradient-based topology optimization of the permeability distribution of the hybrid evaporator-feeding wicks 470, 570, 670 may be performed using the desired uniformity of the fluid mass flux and the fluid velocity on the hybrid evaporator-feeding wicks 470, 570, 670 as constraints to minimize flow resistance of the working fluid. Regions of varying permeability matching the desired minimized flow resistance can be incorporated accordingly to produce better feeding pathways to the heat sources 150. For example, numerical optimization performed utilizing similar boundary conditions described above with a fluid velocity constraint on desired boundaries, assuming pressure maximization in the central region near the heat sources 150 and other conditions noted above, may yield a functionally graded hybrid evaporator-feeding wick 570', as shown in FIG. 10. FIG. 10 depicts a top view graphical representation of the fluid mass flux profiles of the topologically-optimized hybrid evaporator-feeding wick 570' for the vapor chamber 100, where the vapor chamber 100 is in thermal contact with four heat sources 150 symmetrically arranged in a 2×2 array. The hybrid evaporator-feeding wick 570' shown in FIG. 10 is optimized with respect to permeability distribution on its surface to include a cross of high-permeability region (shown in light color) in the central region near inner edges of the four heat sources 150, a low-permeability region (shown in darker color) around the outer edges of the four heat sources 150 and a functionally graded region of medium-permeability throughout. In FIG. 10, the values of permeability represent a scale between 0 (white) and 1 (black) that is normalized based on the maximum value of permeability in the evaporator-feeding wick 570'. Accordingly, the functionally graded regions of medium-permeability appear as grey. The permeability gradient formed by including the regions of varying permeability in the optimized hybrid evaporator-feeding wick 570' can thus be adjusted with the flow of the working fluid such that the working fluid has a uniform flow to the plurality of heat sources.

Figure 11:
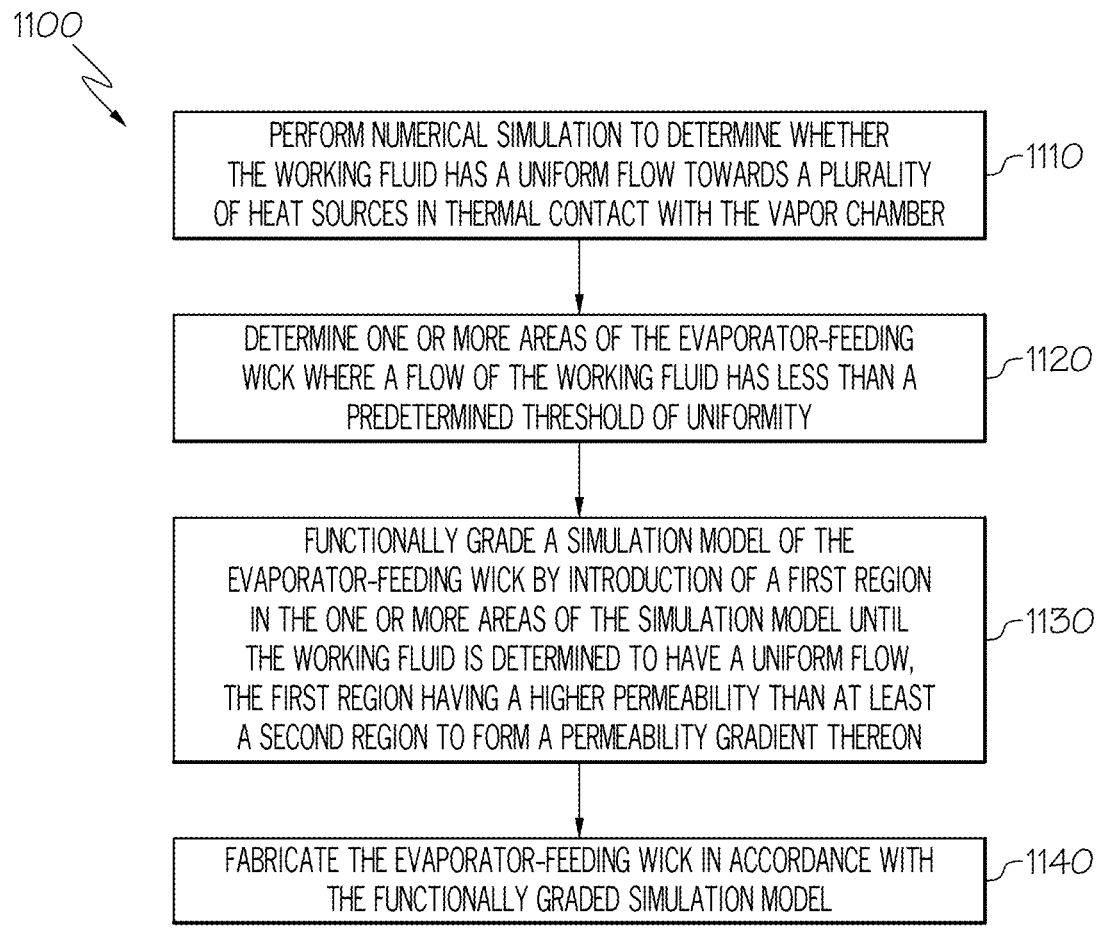
FIG. 11 depicts a block diagram of a method of fabricating an evaporator-feeding wick having a uniform flow of a working fluid therethrough for lining an evaporator wall of a vapor chamber, according to one or more embodiments shown and described herein.

FIG. 11 depicts a block diagram of a method 1100 of fabricating an evaporator-feeding wick having a uniform flow of a working fluid therethrough for lining an evaporator wall of a vapor chamber. In block 1110, numerical simulation is performed to determine whether the working fluid has a uniform flow towards a plurality of heat sources in thermal contact with the vapor chamber. In some embodiments, three-dimensional numerical simulation performed on a commercially-available computational fluid dynamics software (for example, Fluent™) using porous media flow conditions may be used to simulate the fluid mass flux profile of the evaporator-feeding wick for a specified heat input from each of the plurality of heat sources. The outer edges of the evaporator-feeding wick were assumed to have a zero-pressure boundary condition while the inner edges of the plurality of evaporator wicks above each of the plurality of heat sources were assumed to have a fluid mass flux boundary condition representing an assumed conversion of the entire mass of the working fluid fed to the heat sources within the area of the evaporator wicks into vapor form for a specified heat input from each heat source. In block 1120, one or more areas of the evaporator-feeding wick where a flow of the working fluid has less than a predetermined threshold of uniformity, is determined. As a non-limiting example, the predetermined threshold of uniformity may be defined as having an average deviation of about 5% from the median value of the fluid mass flux (in Kg/m²s) along a position between the evaporator wicks, such that only a fluid mass flux of the working fluid less than the threshold may be considered as uniform.

In block 1130, a simulation model of the evaporator-feeding wick is functionally graded by introduction of a first region in the one or more areas of the simulation model, where the first region has a higher permeability than at least a second region to form a permeability gradient. The simulation model of the evaporator-feeding wick may be functionally graded until the working fluid is determined to have a uniform flow. In block 1140, the evaporator-feeding wick is fabricated in accordance with the functionally graded simulation model. In some embodiments, the first region is introduced by sintering particles having larger size (about 180-212 µm in diameter) than the conventional smaller particles (about 90-106 µm in diameter) of the evaporator-feeding wick. In other embodiments, the first region is introduced by chemical treatment or surface treatment of the one or more areas. The chemical treatment may include one or more of: reduction, oxidation, or passivation of the one or more areas using hydrogen, oxygen, or an inert gas, or application of a polymer, surfactant, thin film, etc. The surface treatment may include modification of the particle surface morphology by polishing, roughening, patterning, etc. The surface treatment could either be performed prior to the formation of the hybrid evaporator-feeding wick or in-situ by shaping the particles of a uniform evaporator-feeding wick into the hybrid evaporator-feeding wick.

Figure 12:
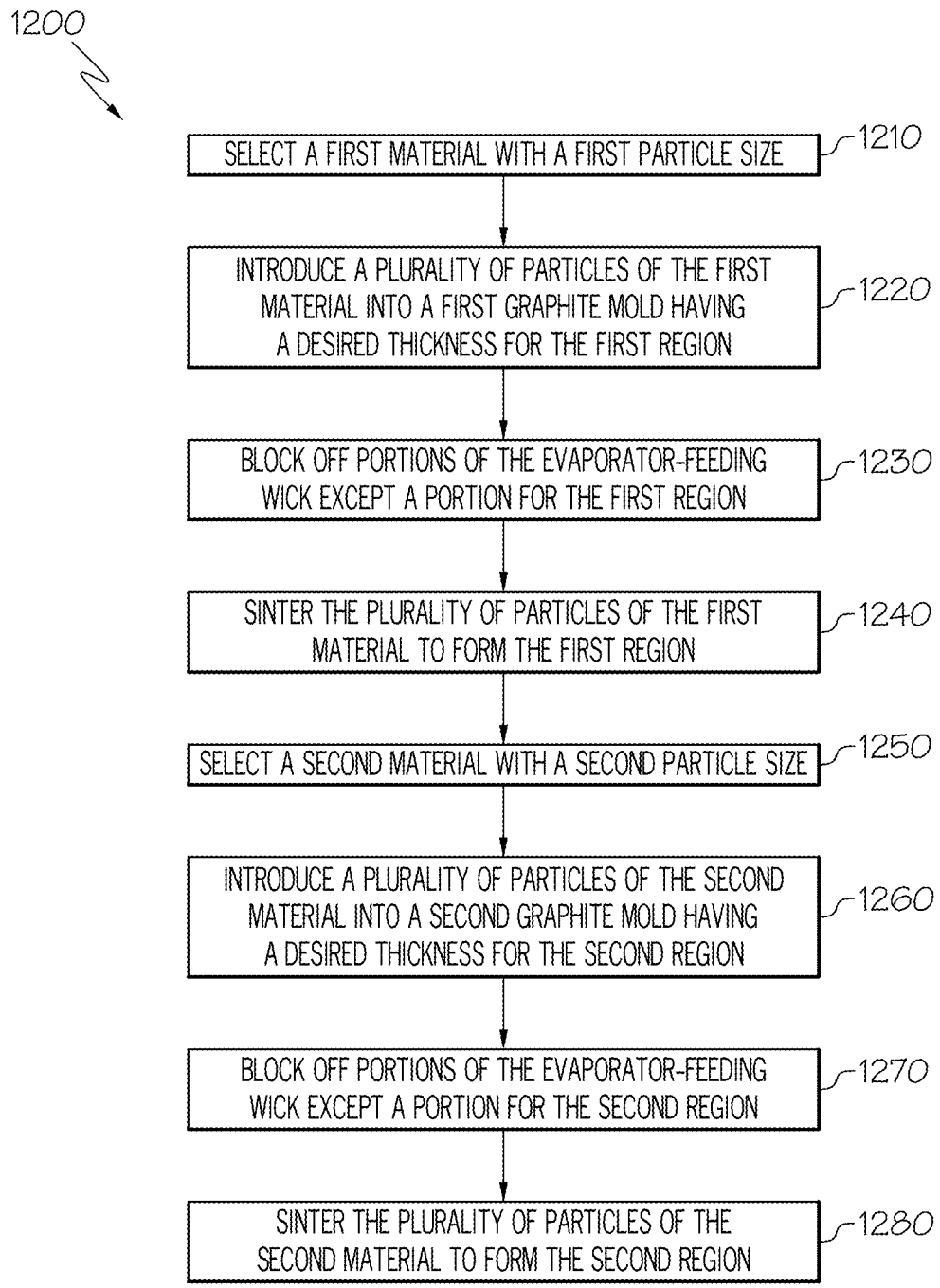
FIG. 12 depicts a block diagram of a method of functionally grading an evaporator-feeding wick of a vapor chamber by introducing a first region and a second region of sintered particles, according to one or more embodiments shown and described herein.

FIG. 12 depicts a block diagram of a method 1200 of functionally grading an evaporator-feeding wick of a vapor chamber by introducing a first region and a second region of sintered particles. In block 1210, a first material with a first particle size is selected. In block 1220, a plurality of particles of the first material is introduced into a first graphite mold having a desired thickness for the first region. In block 1230, portions of the evaporator-feeding wick except a portion for the first region are blocked off. In block 1240, the plurality of particles of the first material is sintered to form the first region. The sintering may be performed in a furnace with a reducing or inert atmosphere at a temperature between about 500-1000 degrees Celsius. In block 1250, a second material with a second particle size is selected. The second particle size maybe larger or smaller than the first particle size. In block 1260, a plurality of particles of the second material is introduced into a second graphite mold having a desired thickness for the second region. In block 1270, portions of the evaporator-feeding wick except a portion for the second region are blocked off. In block 1280, the plurality of particles of the second material is sintered to form the second region. The sintering may be performed in a furnace with a reducing or inert atmosphere at a temperature between about 500-1000 degrees Celsius.

The apparatuses and methods described herein can be advantageously used for uniform fluid delivery to multiple heat sources in thermal contact with a vapor chamber. More uniform fluid flow through the high-permeability regions of the hybrid evaporator-feeding wicks ensures that the working fluid is continuously replenished in the region between or near the evaporator wicks above the heat sources. The continuous supply of working fluid for cooling the heat sources ensures that the thermal resistance and cooling efficiency of the vapor chamber can be reliably maintained over a longer period of time. As a result, the vapor chamber becomes more efficient in dissipating high power density loads over relatively large heat input areas.

It is noted that the terms "substantially" and "about" may be utilized herein to include the inherent degree of uncertainty that may be attributed to any quantitative comparison, value, measurement, or other representation. These terms are also utilized herein to represent the degree by which a quantitative representation may vary from a stated reference without resulting in a change in the basic function and intended scope of the subject matter at issue.

While particular embodiments have been illustrated and described herein, it should be understood that various other changes and modifications may be made without departing from the spirit and scope of the claimed subject matter. Moreover, although various aspects of the claimed subject matter have been described herein, such aspects need not be utilized in combination. It is therefore intended that the appended claims cover all such changes and modifications that are within the scope of the claimed subject matter.

What is claimed is:

1. A vapor chamber comprising:
   an evaporator wall configured to be in thermal contact with a plurality of heat sources;
   a condenser wall configured to be in thermal contact with a heat sink;
   a volume between the evaporator wall and the condenser wall configured for transporting a vapor from the evaporator wall to the condenser wall; and
   a porous wick structure configured to pump a working fluid towards the plurality of heat sources, the porous wick structure comprising an evaporator-feeding wick in thermal contact with the evaporator wall, wherein:
   the evaporator-feeding wick comprises a first region and a second region, the first region having a higher permeability than the second region;
   the first region comprises sintered particles having larger size than particles in the second region; and
   the first region is hour-glass shaped.

2. The vapor chamber of claim 1, wherein the first region of the evaporator-feeding wick is introduced in one or more areas where a flow of the working fluid has less than a predetermined threshold of uniformity.

3. The vapor chamber of claim 1, wherein the first region comprises chemically-treated particles in the one or more areas, the chemical treatment comprising reduction, oxidation, or passivation of the one or more areas using hydrogen, oxygen, or an inert gas or application of a polymer, surfactant, thin film thereon.

4. The vapor chamber of claim 1, wherein the first region comprises surface-treated particles in the one or more areas, the surface treatment comprising a modification of the particle surface morphology by polishing, roughening, or patterning.

5. The vapor chamber of claim 1, wherein the porous wick structure comprises sintered particles of a metal or an alloy based on one or more metals selected from at least one of: nickel, copper, molybdenum, niobium, aluminum, iron, cobalt, and titanium.

* * * * *

UNITED STATES PATENT AND TRADEMARK OFFICE
CERTIFICATE OF CORRECTION

PATENT NO. : 11,300,362 B2
APPLICATION NO. : 16/264258
DATED : April 12, 2022
INVENTOR(S) : Sudhakar et al.

It is certified that error appears in the above-identified patent and that said Letters Patent is hereby corrected as shown below:

In the Specification

In Column 6, Line(s) 36, delete "am" and insert --µm--, therefor.

In Column 6, Line(s) 37, delete "am" and insert --µm--, therefor.

Signed and Sealed this
Thirty-first Day of May, 2022

Katherine Kelly Vidal
*Director of the United States Patent and Trademark Office*